(12) United States Patent
Alrod et al.

(10) Patent No.: US 7,990,764 B2
(45) Date of Patent: Aug. 2, 2011

(54) POST-FACTO CORRECTION FOR CROSS COUPLING IN A FLASH MEMORY

(75) Inventors: Idan Alrod, Tel Aviv (IL); Eran Sharon, Rishon Letzion (IL)

(73) Assignee: SanDisk IL Ltd., Kfar Saba (IL)

( * ) Notice: Subject to any disclaimer, the term of this patent is extended or adjusted under 35 U.S.C. 154(b) by 0 days.

(21) Appl. No.: 12/699,747

(22) Filed: Feb. 3, 2010

(65) Prior Publication Data

US 2010/0135074 A1  Jun. 3, 2010

Related U.S. Application Data

(62) Division of application No. 11/860,553, filed on Sep. 25, 2007, now Pat. No. 7,751,237.

(51) Int. Cl.
*G11C 11/34* (2006.01)
*G11C 16/04* (2006.01)

(52) U.S. Cl. .............................. 365/185.02; 365/185.18

(58) Field of Classification Search ............. 365/185.02, 365/185.18
See application file for complete search history.

(56) References Cited

U.S. PATENT DOCUMENTS

| 7,423,912 B2 * | 9/2008 | Perlegos et al. | 365/185.24 |
| 7,684,237 B2 * | 3/2010 | Moschiano et al. | 365/185.02 |
| 2008/0298127 A1 * | 12/2008 | Kim et al. | 365/185.17 |

* cited by examiner

*Primary Examiner* — Anh Phung
(74) *Attorney, Agent, or Firm* — Martine Penilla Gencarella LLP.

(57) ABSTRACT

A method of storing and reading data, using a memory that includes a plurality of cells (e.g. flash cells), such that data are stored in the cells by setting respective values of a physical parameter of the cells (e.g. threshold voltage) to be indicative of the data, and such that data are read from the cells by measuring those values. One of the cells and its neighbors are read. The data stored in the cell are estimated, based on the measurements and on respective extents to which the neighbors disturb the reading. Preferably, the method also includes determining those respective extents to which the neighbors disturb the reading, for example based on the measurements themselves.

14 Claims, 6 Drawing Sheets

POST-FACTO CORRECTION FOR CROSS COUPLING IN A FLASH MEMORY

CLAIM OF PRIORITY

This application is a Divisional application under 35 USC §120, of U.S. application Ser. No. 11/860,553, filed on Sep. 25, 2007 now U.S. Pat. No. 7,751,237, issued on Jul. 6, 2010, entitled "Post-Facto Correction for Cross Coupling in a Flash Memory", and is herein incorporated by reference.

FIELD AND BACKGROUND OF THE INVENTION

The present invention relates to non-volatile memories and, more particularly, to flash memories, especially flash memories that store several bits per cell.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no need to accurately read the cell's threshold voltage—all that is needed is to correctly identify in which of the two states the cell is currently located. For that purpose it suffices to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurity concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory. The terms "writing" and "programming" are used interchangeably herein.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short (This nomenclature is misleading, because the previous type of flash cells also has more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell. In order to simplify the explanations, the two-bit case is emphasized herein. It should however be understood the present invention is equally applicable to flash memory devices that support more than two bits per cell.) In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one of the states. As for the SBC case, each state is actually a range of threshold voltages and not a single threshold voltage. When reading the cell's contents, all that must be guaranteed is that the range that the cell's threshold voltage is in is correctly identified. For a prior art example of an MBC flash device see U.S. Pat. No. 5,434,825 to Harari.

When encoding two bits in an MBC cell as one of the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are illustrated as assigned in the following order from left to right "10", "00", "01". One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of Chen. It should be noted though that the present invention does not depend on this assignment of the states, and there are other ordering that can be used. When reading an MBC cell's content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there are also some drawbacks to using MBC flash—the average read and write times of MBC memories are longer than of SBC memories, resulting in lower performance. Also, the reliability of MBC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there are advantages to using both MBC cells and SBC cells, and the selection can be different depending on the application's requirements.

While the above explanations deal with floating-gate flash memory cells, there are other types of flash memory technologies. For example, in the NROM flash memory technology there is no conductive floating gate but instead there is an insulating layer trapping the electric charge. The present invention is equally applicable to all flash memory types, even though the explanations herein are given in the context of floating-gate technology.

FIG. 2A, which is identical to FIG. 1 of Chen, is a block diagram of a typical prior art flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a program operation, and for controlling voltage levels of the bit lines (BL) to promote the programming or to inhibit the programming. Row control circuit 3 is connected to word lines (WL) to select one of the word lines (WL), to apply read voltages, to apply programming voltages combined with the bit line voltage levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage. Typically, in a NAND flash device, the cells controlled by one word line correspond to one or two pages of the device, and the word lines are organized into blocks, with each block typically including a number of word lines that is a moderate power of 2, e.g., $2^5$=32. A page is the smallest unit of a NAND flash device whose cells can be programmed together. A block is the smallest unit of a NAND flash device whose cells can be erased together.

The data stored in the memory cells (M) are read out by column control circuit 2 and are output to external I/O lines via an I/O line and a buffer in data input/output circuit 6. Program data to be stored in the memory cells are input to the buffer in data input/output circuit 6 via the external I/O lines, and are transferred to the column control circuit 2. The external I/O lines are connected to a controller 20.

Command data for controlling the flash memory device are input to a command interface connected to external control lines that are connected with controller 20. The command data inform the flash memory of what operation is requested. The input command is transferred to a state machine 8 that controls column control circuit 2, row control circuit 3, c-source control circuit 4, c-p-well control circuit 5 and data input/output circuit 6. State machine 8 can output a status data of the flash memory such as READY/BUSY or PASS/FAIL.

Controller 20 is connected or connectable with a host system such as a personal computer, a digital camera, a personal digital assistant. It is the host that initiates commands, such as to store or read data to or from memory array 1, and provides or receives such data, respectively. Controller 20 converts such commands into command signals that can be interpreted and executed by command circuits 7. Controller 20 also typically contains buffer memory for the user data being written to or read from memory array 1. A typical memory system includes one integrated circuit chip 21 that includes controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

FIG. 2B, which is identical to FIG. 1 of U.S. Pat. No. 6,751,766 to Guterman et al., is a block diagram of another typical prior art flash memory device. A large number of individually addressable memory cells are arranged in a regular array 11 of rows and columns. Individual memory cells can be controlled by bit lines, select gates arranged in word lines, and steering gates. Bit lines are designated herein to extend along columns of array 11, and word lines are designated to extend along the rows of array 11. Bit line unit 13 may include a bit line decoder, storage elements, driver circuits and sense amplifiers. Bit line unit 13 can be coupled to cell array 11 by line 15, and to controller 27 by bit-control line 29 and by read line 41. Word line unit 19 may include a select gate decoder and driver circuits. Word line unit 19 can be coupled to cell array 11 by line 17, and to controller 27 by word-control line 31. Steering line unit 43 may include a steering gate decoder and driver circuits. Steering unit 43 can be coupled to cell array 11 by line 23, to controller 27 by steering-control line 33, and to bit line unit 13 by line 44. Bit line unit 13, word line unit 19 and steering unit 43 can be coupled to bus 25, which in turn is coupled to controller 27. Controller 27 can be coupled to the host by line 35.

When a preselected memory cell is to be programmed, voltages can be applied to the bit lines, word line and steering gates, corresponding to the preselected memory cell, at predetermined levels sufficient for the programming of the preselected cell. Controller 27 sends the address of the preselected memory cell through bus 25 to the respective decoders in bit line unit 13, word line unit 19, and steering gate unit 43 through lines 26a, 26b, and 26c, respectively. Status and control commands between bit line unit 13, word line unit 19, steering gate unit 43 and controller 27 are communicated through bit-control line 29, word-control line 31 and steering control line 33.

When a preselected memory cell is to be read, voltages can be applied to the corresponding bit lines, word line and steering gates, corresponding to the preselected memory cell, at predetermined levels, sufficient to enable the reading of the preselected memory cell. Controller 27 is capable of applying the voltages of the bit lines through bit-control line 29, applying the voltages of the word lines through word-control line 31 and applying the voltages of steering gates through steering control line 33. A current can be generated through the preselected memory cell by these voltages. The current is indicative of whether the preselected memory cell was programmed or not. The value of the current can be amplified and compared against references by sense amplifiers in bit line unit 13, the result of which can be temporarily stored in latches or registers. The resultant data, read out from the preselected memory cell, can be sent to controller 27 through read line 41.

Shifts in the apparent charge stored on a floating gate can occur because of the coupling of an electric field based on the charge stored in adjacent floating gates. This floating-gate-to-floating-gate coupling phenomenon, which also is referred to herein as "inter-cell cross coupling", is described by Chen and Fong in U.S. Pat. No. 5,867,429, which patent is incorporated by reference for all purposes as if fully set forth herein. A floating gate adjacent to a target gate may be a neighboring floating gate on the same bit line, a neighboring floating gate on the same word line, or a floating gate that is diagonal from the target floating gate because it is on both a neighboring bit line and on a neighboring word line.

The floating-gate-to-floating-gate coupling phenomenon occurs most pronouncedly between sets of adjacent memory cells that have been programmed at different times. For example, suppose a first memory cell is programmed to add a level of charge to its floating gate that corresponds to one set of data. Suppose that subsequently, one or more adjacent memory cells are programmed to add a level of charge to their floating gates that correspond to a second set of data. After the one or more of the adjacent memory cells are programmed, the charge level read from the to first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the stored data.

The effect of the floating-gate-to-floating-gate coupling is of greater concern for MBC devices than for SBC devices because in MBC devices the threshold voltage ranges that define the states of the cells are narrower than in SBC devices.

Several approaches are known for compensating for floating-gate-to-floating-gate coupling. Chen and Fong structure a flash memory so that cells whose floating gates otherwise would be coupled are isolated physically from each other. Alternatively, Chen and Fong adjust reference comparison voltages (e.g. $V_1$ and $V_2$ in FIG. 1B) in a manner that compensates for floating-gate-to-floating-gate coupling. Chen, Cernea and Hemnik teach a similar method in U.S. Pat. No. 7,196,946. The Chen, Cernea and Hemnik patent is incorporated by reference for all purposes as if fully set forth herein. Error-correction encoding of data to be stored, followed by error-correction decoding of the data as read, that is used routinely to compensate for inaccuracies generally in reading data from flash memories, also compensates for floating-gate-to-floating-gate coupling.

FIG. 3, which is identical to FIG. 8A of Chen and Fong, shows schematically an array of flash memory cells, including nine such cells labeled with reference numbers 151 through 159. The numbers along the dashed arrows in FIG. 3 are coupling ratios between the cells connected by the arrows. To determine the reference comparison voltages appropriate e.g. for reading cell 151, Chen and Fong read neighbor cells 152 through 159 (or at least cells 152 and 156, the cells most strongly coupled to cell 151) and combine these readings with the respective coupling ratios to cell 151 to determine how much to shift the reference comparison voltages of cell 151 from the default values of these reference comparison voltages.

The above discussion assumes that threshold voltages are read with a resolution on the order of the widths of the threshold voltage ranges that define the states of the cells. It often is advantageous to read the threshold voltages with a finer resolution, as taught e.g. by Ban in US Patent Application No. 2005/0013165. FIG. 4, which is modified from FIG. 2 of Ban, shows the threshold voltage distributions of MBC cells that store three bits each. A cell whose threshold voltage is in threshold voltage distribution 110, between $V_{min}$ and $V_1$, is interpreted as being in a state corresponding to the bit pattern "111". A cell whose threshold voltage is in threshold voltage distribution 112, between $V_1$ and $V_2$, is interpreted as being in a state corresponding to the bit pattern "110". A cell whose threshold voltage is in threshold voltage distribution 114, between $V_2$ and $V_3$, is interpreted as being in a state corresponding to the bit pattern "101". A cell whose threshold voltage is in threshold voltage distribution 116, between $V_3$ and $V_4$, is interpreted as being in a state corresponding to the bit pattern "100". A cell whose threshold voltage is in threshold voltage distribution 118, between $V_4$ and $V_5$, is interpreted as being in a state corresponding to the bit pattern "011". A cell whose threshold voltage is in threshold voltage distribution 120, between $V_s$ and $V_6$, is interpreted as being in a state corresponding to the bit pattern "010". A cell whose threshold voltage is in threshold voltage distribution 122, between $V_6$ and $V_7$, is interpreted as being in a state corresponding to the bit pattern "001". A cell whose threshold voltage is in threshold voltage distribution 124, between $V_7$ and $V_{max}$, is interpreted as being in a state corresponding to the bit pattern "000". Ban teaches reading such MBC cells by comparing the cells' threshold voltages not just to reference comparison voltages $V_1, V_2, V_3, V_4, V_5, V_6$ and $V_7$, that bound the threshold voltage ranges that define the states of the cells, and that Ban calls "integral" reference comparison voltages, but also to what Ban calls "fractional" reference comparison voltages ($V_{0.5}, V_{1.5}, V_{2.5}, V_{3.5}, V_{4.5}, V_{6.5}$ and $V_{7.5}$). The results of reading flash cells with a resolution on the order of the widths of the threshold voltage ranges that define the states of the cells often is called "hard bits" and the results of reading flash cells with a finer resolution often is called "soft bits".

SUMMARY OF THE INVENTION

The present invention is based on the insight that coupling ratios, such as those illustrated in FIG. 3, can be used for correcting threshold voltages, as read using default reference comparison voltages, for inter-cell cross coupling without changing the reference comparison voltages. This insight is based on the formal similarity between inter-cell cross coupling and a similar problem that arises in communication engineering, inter-symbol interference (ISI).

In digital communication, a transmitter sends a sequence of symbols $\bar{x}_i$ encoded in a signal. A receiver of the signal samples the received signal to recover the transmitted symbols. If the communication channel between the transmitter and the receiver were perfect, the recovered symbols $x_i$ would be identical to the transmitted symbols $\bar{x}_i$. Often, however, the recovered symbols are contaminated by channel noise and by interference from other transmitted symbols. In a linear channel with additive noise the channel output $x_i$ is given by $$x_i = \sum_j c_j \bar{x}_{i-j} + n_i$$

where $n_i$ is additive channel noise. A procedure called "channel estimation" is used to construct, on the basis of the recovered symbols, the coefficients $\alpha_i$ of a filter that, when applied to the recovered symbols in a subsequent procedure called "equalization", produces estimates of the transmitted symbols. A linear equalizer produces an estimate of the transmitted symbol as a linear combination of the received symbols:

$$\hat{x}_i = \sum_j a_j x_{i-j}$$

This equalization mitigates the inter-symbol interference but usually does not cancel the ISI completely because the additive channel noise does not allow inversion of the transformation performed by the channel even if the equalizer is optimal (i.e. not limited by practical limitations such as a finite number of equalizer taps).

The present invention is based on the insight that inter-cell cross coupling is formally the same as ISI, so that channel estimation techniques can be used to measure inter-cell cross coupling and so that equalization techniques can be used to correct for inter-cell cross coupling. The following table shows the correspondences between ISI parameters and flash memory parameters in the case of linear models of ISI and inter-cell cross coupling:

| parameter | ISI | Inter-cell cross coupling |
|---|---|---|
| $\bar{x}_i$ | transmitted symbol | programmed threshold voltage |
| $x_j$ | received symbol | read threshold voltage |
| $\hat{x}_i$ | corrected symbol | corrected threshold voltage |
| $c_j$ | ISI coefficient | cross-coupling coefficient |

This presentation of the correspondences between ISI and inter-cell cross coupling is based on linear models of ISI and inter-cell cross coupling. Both ISI and inter-cell cross coupling can be modeled by equivalent nonlinear models, and a similar correspondence can be made between the parameters of nonlinear channel estimation and equalization and the parameters of nonlinear estimation and correction of inter-cell cross coupling. Although the scope of the present invention includes nonlinear estimation and correction of inter-cell cross coupling, the emphasis herein is on linear estimation and correction of inter-cell cross coupling, as linear correction is the preferred embodiment of the present invention.

Therefore, according to the present invention there is provided a method of storing and reading data, including the steps of: (a) providing a memory that includes a plurality of cells, data being stored in the cells by setting respective values of a physical property of the cells to be indicative of the data, the cells subsequently being read by measuring the respective values to obtain respective measurements of the respective values; (b) reading one of the cells and at least one neighbor cell of the one cell, thereby obtaining the respective measurements for the one cell and for each neighbor cell; and (d) estimating respective data that have been stored in the one cell, based on the respective measurements and on a respective extent to which each neighbor cell disturbs the reading of the one cell.

Furthermore, according to the present invention there is provided a memory device including: (a) a memory including a plurality of cells; (b) circuitry for: (i) storing data in the cells by setting respective values of a physical property of the cells to be indicative of the data, and (ii) subsequently reading the cells by measuring the respective values to obtain respective measurements of the respective values; and (c) a mechanism for estimating respective data that have been stored in one of the cells, based on the respective measurements of the one cell and of at least one neighbor cell of the one cell and also based on a respective extent to which each neighbor cell disturbs the reading of the one cell.

Furthermore, according to the present invention there is provided a system including: (a) a memory device including: (i) a plurality of cells, and (ii) circuitry for: (A) storing data in the cells by setting respective values of a physical property of the cells to be indicative of the data, and (B) subsequently reading the cells by measuring the respective values to obtain respective measurements of the respective values; (b) a non-volatile memory wherein is stored driver code for said memory device, said driver code including code for estimating respective data that have been stored in one of the cells, based on the respective measurements of the one cell and of at least one neighbor cell of the one cell and also based on a respective extent to which each neighbor cell disturbs the reading of the one cell; and (d) a processor for executing the code.

Furthermore, according to the present invention there is provided a computer-readable storage medium having computer-readable code embedded thereon, the computer-readable code being driver code for a memory device that includes a plurality of cells, data being stored in the cells by setting respective values of a physical property of the cells to be indicative of the data, the cells subsequently being read by measuring the respective values to obtain respective measurements of the respective values, the computer-readable code including program code for estimating respective data that have been stored in one of the cells, based on the respective measurements of the one cell and of at least one neighbor cell of the one cell and also based on a respective extent to which each neighbor cell disturbs the reading of the one cell.

The basic method of the present invention is a method of storing and reading data, using a memory that includes a plurality of cells. Data are stored in the cells by setting respective values of a physical property of the cells to be indicative of the data to be stored in the cells. For example, if the cells are flash cells, the preferred physical property is the threshold voltage of the flash cells. Subsequent to storing the data in the cells, the cells are read by measuring their respective values of the physical property to obtain respective measurements of those respective values. One of the cells (the "target cell") and one or more of its neighbors are read, thereby obtaining the respective measurements of the target cell and of the neighbor cell(s). In the case of a flash memory device such as the devices of FIGS. 2A and 2B, the measurement may be either hard bits (e.g. "0<threshold voltage<$V_1$" in FIG. 1B) or soft bits (e.g. "$V_{1.5}$<threshold voltage<$V_2$" in FIG. 4). Note that the measurements may not be consistent with the respective values of the physical property as set when the data were stored. For example, a flash cell programmed to state "110" of FIG. 4 may be read as having a threshold voltage greater than $V_2$ and so as being in state "101" of FIG. 4. The point of the present invention is to correct for such misreadings, insofar as such misreadings are caused by inter-cell cross coupling. Finally, the data that actually were stored in the target cell are estimated, based on the respective measurements and on the respective extent to which each neighbor cell disturbs the reading of the target cell. "Estimating" is understood herein to be exclusively computational, and to not include e.g. re-setting the reference comparison voltages that are used to read the cells and then re-reading the cells, as in Chen and Fong. Because the preferred embodiments discussed below perform this estimating using ISI equalization algorithms adapted from the field of communication engineering, this estimating also is referred to herein as "equalizing".

Preferably, the method also includes determining the respective extent to which each neighbor cell of the target cell disturbs the reading of the target cell. Typically, the determining is effected using a suitable ISI channel estimation algorithm adapted from the field of communication engineering. Hence, this determining also is referred to herein as "cross-coupling estimation". The determining may be based either on a nonlinear model of the inter-cell cross coupling or on a linear model of the inter-cell cross coupling. The determining may be effected separately (i.e. prior to) the equalizing, as in the batch cross-coupling estimation discussed below, or iteratively along with the equalizing, as in the adaptive cross-coupling estimation and equalization discussed below. The determining may be based on criteria such as minimal mean square error (MMSE), maximal a-postiori probability (MAP) or maximum likelihood (ML).

More preferably, the determining of the respective extent to which each neighbor cell disturbs the reading of the target cell is based on the respective measurements as obtained by reading the target cell and its neighbor cell(s). Most preferably, the method also includes reading one or more additional cells other than the target cell and the neighbor cell(s), thereby obtaining one or more additional measurements. The determining of the respective extent to which each neighbor cell disturbs the target cell then is based also on the one or more additional measurements. For example, in the LMMSE algorithm discussed below, one of the statistics is $\mu_{0|s}$, which is obtained from measurements on M cells, all of which are presumed to be in the same state s as the target cell. For example, the target cell and the additional cell(s) could share a common erase block of a flash memory or a common word line of a flash memory.

Also more preferably, the method also includes storing the data in the target cell and in its neighbor cell(s). In one more preferable mode of the method, the determining of the respective extent to which each neighbor cell disturbs the reading of the target cell is effected before the data are stored in the target cell and in the neighbor cell(s). For example, the respective extent to which each neighbor cell disturbs the reading of the target cell may be determined when the memory is designed or when the memory is fabricated, before a user of the memory ever stores and reads data. In another more preferable mode of the method, the determining of the respective extent to which each neighbor cell disturbs the reading of the target cell is effected after the data are stored in the target cell and in the neighbor cell(s). For example, in the background determination option discussed below, data are written to the target cell and to its neighbor cell(s), the target cell and the neighbor cell(s) are read in background only for the purpose of the determination, the respective extent to which each neighbor cell disturbs the reading of the target cell is determined from the results of that reading, and that/those respective extent(s) is/are used in the estimation of data when the same, data are subsequently read from the target cell by a user of the memory. An important special case of this mode is the on-the-fly determination and equalization option discussed below: effect the determination whenever the target cell is read, in order to estimate the data that were stored most recently in the target cell.

Another more preferable alternative is to store other data in the target cell and in its neighbor cell(s), and to then read the target cell and its neighbor cell(s), thereby obtaining respective other measurements for the target cell and for its neighbor cell(s). The respective extent to which each neighbor cell disturbs the reading of the target cell then is determined on the basis of the other measurements. For example, in the background determination option discussed below, data are written to the target cell and to its neighbor cell(s), the target cell and the neighbor cell(s) are read in background only for the purpose of the determination, the respective extent to which each neighbor cell disturbs the reading of the target cell is determined from the result of that reading, and, subsequent to replacing the data used for the determination by other data, that/those respective extent(s) is/are used in the estimation of the new data when the new data are read from the target cell by a user of the memory. As another example, one way of determining the respective extent to which each neighbor cell disturbs the target cell when the memory is fabricated is to program the target cell and the neighbor cell(s) to store known data (i.e., data that also are stored elsewhere), with the determining then being based both on measurements of the target cell and the neighbor cell (s) as so programmed and on the data as stored separately from the memory.

Preferably, the estimating includes correcting the respective measurement of the target cell for the disturbance by the neighbor cell(s). Alternatively, the respective measurement of the target cell is not corrected. Instead, one or more expectation values of parameters of a distribution of the respective value of the cell are estimated and are used in subsequent processing. The examples of such expectation values in the LMMSE example below are $\mu_{0|s,N}$ and $\sigma_{0|s,n}^2$.

Like the determining, the estimating may be based on criteria such as MMSE, MAP or ML.

A memory device of the present invention includes a memory and an equalization mechanism. The memory includes a plurality of cells. Data are stored in the cells by setting respective values of a physical property of the cells to be indicative of the data. Subsequently, the cells are read by measuring those respective values to obtain measurements of the respective values. Because the measurements thus obtained may not be consistent with the respective values of the physical property as set when the data were stored, the equalization mechanism estimates the data using one or more of the methods of the present invention. The equalization mechanism could be implemented either in hardware (e.g. in the circuits that read the cells) or in firmware or software (e.g. in a controller of the memory).

A system of the present invention includes a memory device, a nonvolatile memory and a processor. The memory device includes a memory with a plurality of is cells. Data are stored in the cells by setting respective values of a physical property of the cells to be indicative of the data. Subsequently, the cells are read by measuring those respective values to obtain measurements of the respective values. In the nonvolatile memory is stored driver code for the memory device. The driver code includes code that, when executed by the processor, estimates data that are stored in the memory device using one or more methods of the present invention. The scope of the present invention includes a computer-readable storage medium having embedded thereon such driver code.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1A:
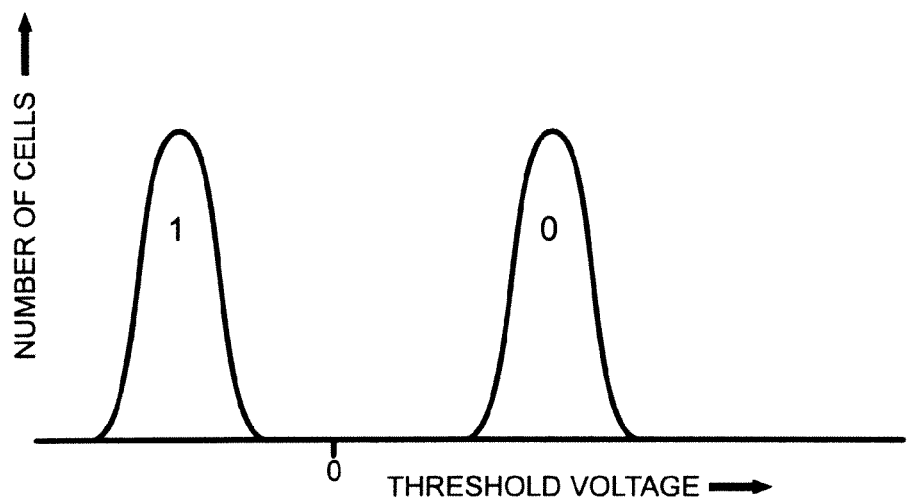
FIG. 1A illustrates the threshold voltage distributions of flash cells programmed in 1-bit mode.
Figure 1B:
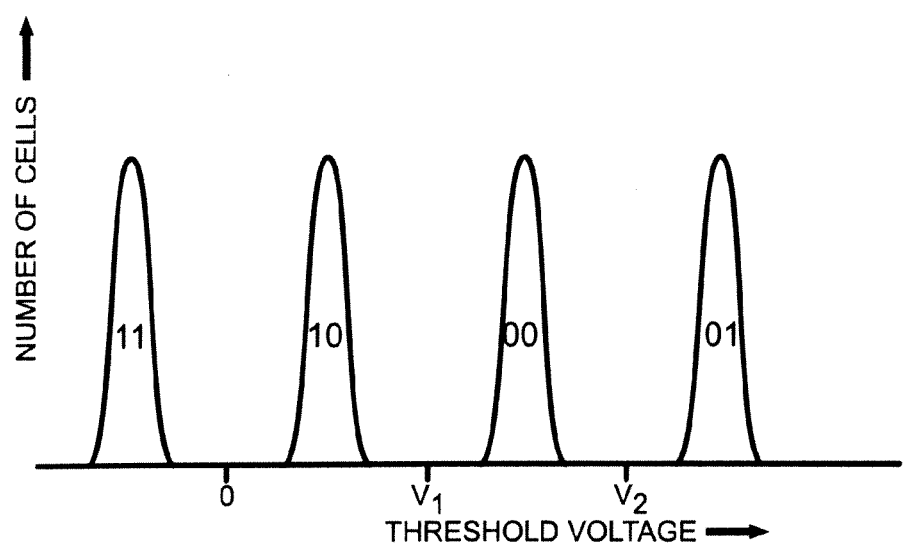
FIG. 1B illustrates the threshold voltage distributions of flash cells programmed in 2-bit mode.

The principles and operation of correction for inter-cell cross coupling according to the present invention may be better understood with reference to the drawings and the accompanying description.

As noted above, the linear model of inter-cell cross coupling correction is $$\hat{x}_i = \sum_j a_j x_{i-j} \qquad (1)$$

where $x_i$ is the threshold voltage of the target cell as read, the $x_{i-j}$ ($j \neq i$) are the threshold voltages, as read, of the neighbor cells that disturbed the target cell subsequent to the programming of the target cell, and $\hat{x}_i$ is the estimate of the threshold voltage of the target cell as the cell was programmed. More generally, the linear model of inter-cell cross coupling correction is $$\hat{x}_i = \sum_j a_j x_{i-j} + b \qquad (2)$$

where b is a constant offset.

One preferred technique that is used for cross-coupling estimation and equalization is Linear Minimal Mean Square Error (LMMSE) cross-coupling estimation and equalization. This technique is based on second order statistics of the target cells and their neighbors, specifically on the covariance matrix of the read threshold voltages of the neighbors and on the cross-correlation vector of the target cells and their neighbors.

The following example is for a flash memory that is programmed one word line at a time, with the cells on the even bit lines being programmed before the cells on the odd bit lines. Inter-cell cross coupling affects primarily the cells on the even bit lines; and the two neighbors that affect each such cell are the cell on the same word line and on the next bit line, and the cell on the same bit line and on the next word line. This example is of the estimation of inter-cell cross coupling and the correction for inter-cell cross coupling of the threshold voltages $x_{0,i}$, $i=1,\ldots,M$, as read, of M of these target cells that are presumed to have been programmed to a particular state s, given, for each target cell, $x_{0,i}$ and the threshold voltages $x_{1,i}$ and $x_{2,i}$, as read, of the target cell's two significant neighbor cells. $x_{1,i}$ is the threshold voltage, as read, of the cell on the same word line and the next bit line. $x_{2,i}$ is the threshold voltage, as read, of the cell on the same bit line and the next word line.

The following second order statistics are used:

$$\mu_{0|s} = \qquad (3)$$
$$E[x_0 \text{ given that the cell was programmed to state } s] = \frac{1}{M}\sum_{i=1}^{M} x_{0,i}$$

-continued $$\mu_1 = E[x_1] = \frac{1}{M}\sum_{i=1}^{M} x_{1,i} \qquad (4)$$

$$\mu_2 = E[x_2] = \frac{1}{M}\sum_{i=1}^{M} x_{2,j} \qquad (5)$$

$$C_{0,N} = E[(x_0 - \mu_{0|s})(x_1 - \mu_1)(x_0 - \mu_{0|s})(x_2 - \mu_2)] \qquad (6)$$

$$= \begin{bmatrix} \frac{1}{M}\sum_{i=1}^{M}(x_{0,i} - \mu_{0|s})(x_{1,i} - \mu_1) \\ \frac{1}{M}\sum_{i=1}^{M}(x_{0,i} - \mu_{0|s})(x_{2,i} - \mu_2) \end{bmatrix}$$

$$C_N = E\begin{bmatrix} (x_1 - \mu_1)^2 & (x_1 - \mu_1)(x_2 - \mu_2) \\ (x_1 - \mu_1)(x_2 - \mu_2) & (x_2 - \mu_2)^2 \end{bmatrix} \qquad (7)$$

$$= \begin{bmatrix} \frac{1}{M}\sum_{i=1}^{M}(x_{1,i} - \mu_1)^2 & \frac{1}{M}\sum_{i=1}^{M}(x_{1,i} - \mu_1)(x_{2,i} - \mu_2) \\ \frac{1}{M}\sum_{i=1}^{M}(x_{1,i} - \mu_1)(x_{2,i} - \mu_2) & \frac{1}{M}\sum_{i=1}^{M}(x_{2,i} - \mu_2)^2 \end{bmatrix}$$

In one mode of the present invention, these second-order statistics are used to correct the read threshold voltages of the target cells. In one example, these statistics were computed for a block of a four-bit-per-cell flash memory, for the state s=8. The resulting statistics were:

$$\mu_{0|s} = 3265 \text{ mv}$$

$$\mu_1 = 3060 \text{ mv}$$

$$\mu_2 = 3060 \text{ mv}$$

$$C_{0,N} = [29{,}788 \text{ mv}^2 \; 65{,}608 \text{ mv}^2]$$

$$C_N = \begin{bmatrix} 2{,}902{,}396 \text{ mv}^2 & 6{,}818 \text{ mv}^2 \\ 6{,}818 \text{ mv}^2 & 2{,}887{,}355 \text{ mv}^2 \end{bmatrix}$$

For any one of the M target cells, the corrected threshold voltage then is $$\hat{x}_0 = x_0 - C_{0,N} C_N^{-1} \begin{bmatrix} x_1 - \mu_1 \\ x_2 - \mu_2 \end{bmatrix} \qquad (8)$$

$$= x_0 - 0.0102 x_1 - 0.0227 x_2 + 100.7 \, mv$$

The data stored in each target cell is determined by finding the threshold voltage range in which $\hat{x}_0$ falls.

In terms of the two phases of the present invention, cross-coupling estimation and equalization, the computation of the second order statistics of equations 3-7 is LMMSE cross-coupling estimation and the subsequent computation of $\hat{x}_0$ in equation 8 is LMMSE equalization.

In another mode of the present invention, the second-order statistics are used to estimate directly the data stored in each target cell without correcting the measured threshold voltage of the cell. For each target cell, the following additional second-order statistics are computed:

1. For each possible state s, the expectation value of the threshold voltages of the cells in state s whose neighbors are in the same set of states (labeled by index N) as the neighbors of the target cell, assuming that the target cell also was programmed to that state s (and not necessarily to the state s that corresponds to $x_0$ as measured):

$$\mu_{0|s,N} = \mu_{0|s} + C_{0,N} C_N^{-1} \begin{bmatrix} x_1 - \mu_1 \\ x_2 - \mu_2 \end{bmatrix} \quad (9)$$

2. The expectation value of the variance of the threshold voltages of these cells: $\sigma_{0|s,N} = C_{0,0} - C_{0,N} \cdot C_N^{-1} \cdot C^*_{0,N} (C^*_{0,N}$ is the conjugate transpose of $C_{0,n}$. In the present case, all quantities are real, so $C^*_{0,N}$ is the transpose of $C_{0,n}$), where $$C_{0,0} = \sigma_{0|s}^2 = \frac{1}{M} \sum_{i=1}^{M} (x_{0,i} - \mu_{0,s})^2 \quad (10)$$

These second-order statistics are used to compute, for each bit i stored in a target cell, the log likelihood ratio (the logarithm of the ratio of the probability that the bit was programmed as "zero" to the probability that the bit was programmed as "one") as follows:

$$L_i = \log \left[ \frac{\sum_{s \in s_i^0} \frac{1}{\sqrt{2\pi\sigma_{0|s,N}}} \exp\left(-\frac{(x_0 - \mu_{0|s,N})^2}{2\sigma_{0|s,N}^2}\right)}{\sum_{s \in s_i^1} \frac{1}{\sqrt{2\pi\sigma_{0|s,N}}} \exp\left(-\frac{(x_0 - \mu_{0|s,N})^2}{2\sigma_{0|s,N}^2}\right)} \right] \quad (11)$$

Figure 4:
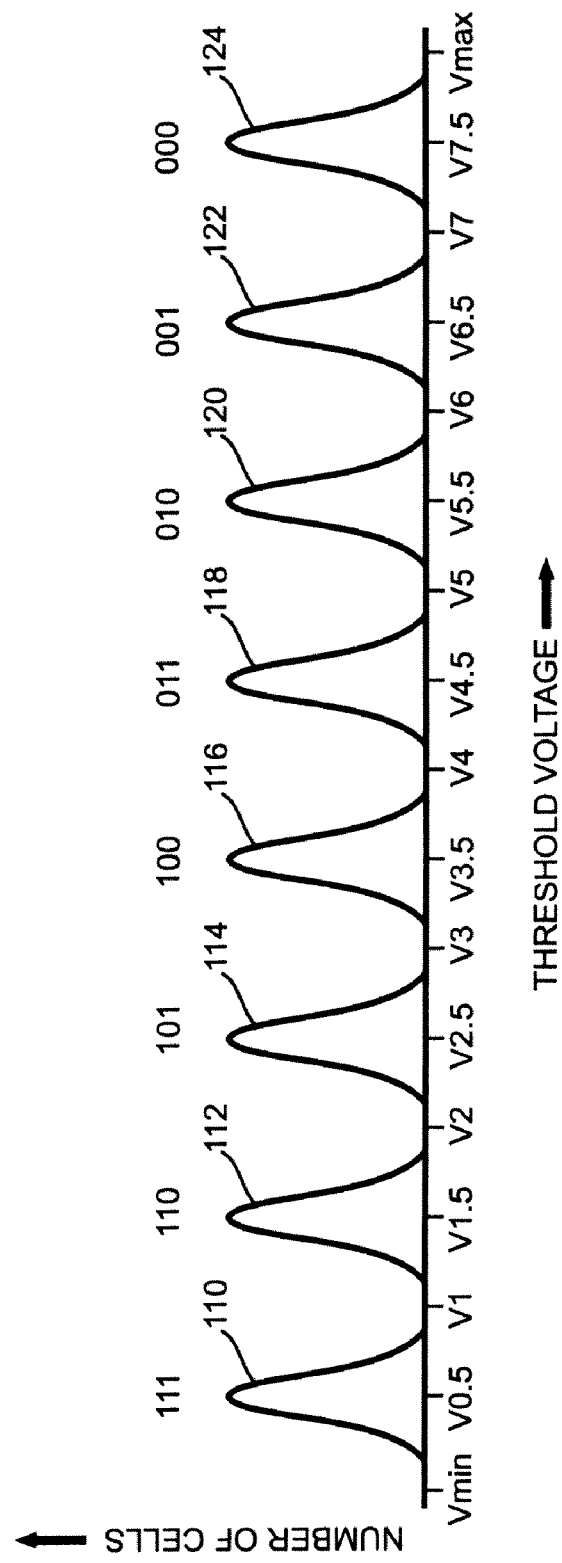
FIG. 4 illustrates the threshold voltage distributions of flash cells programmed in 3-bit mode and read as soft bits.

The sum over $s_i^0$ is a sum over all states s for which bit i is a "zero" bit. The sum over $s_i^1$ is a sum over the remaining states, i.e., all states s for which bit i is a "one" bit. For example, in a three-bit-per-cell flash memory, with states mapped to threshold voltages as shown in FIG. 4, for the leftmost bit, the sum in the numerator would be over the four rightmost states and the sum in the denominator would be over the four leftmost states; for the middle bit, the sum in the numerator would be over the third and fourth states from the left and the first and second states from the right and the sum in the denominator would be over the first and second states from the left and over the third and fourth states from the right; and for the rightmost bit, the sum in the numerator would be over the second and fourth states from the left and the first and third states from the right and the sum in the denominator would be over the first and third states from the left and the second and fourth states from the right.

If the sums are restricted to only to the state $s_i^0$ nearest $x_0$ whose i-th bit is "zero" and the state $s_i^1$ nearest $x_0$ whose i-th bit is "one", this expression for $L_i$ becomes much simpler:

$$L_i \approx \frac{(x_0 - \mu_{0|s_i^1,N})^2}{2\sigma_{0|s_i^1,N}^2} - \frac{(x_0 - \mu_{0|s_i^0,N})^2}{2\sigma_{0|s_i^0,N}^2} + \log \frac{\sigma_{0|s_i^1,N}}{\sigma_{0|s_i^0,N}} \quad (12)$$

$L_i$ as computed using either equation 11 or equation 12 can be used as input to an ECC decoder for estimating the codeword that includes bit i.

In this mode of the present invention, the computation of the second order statistics of equations 3-7, 9 and 10 is LMMSE cross-coupling estimation and the computation of $L_i$ in equation 11 or in equation 12 is LMMSE equalization.

The LMMSE cross-coupling estimation described above is an example of batch cross-coupling estimation. The input to batch cross-coupling estimation includes estimates of all the relevant data (e.g. the full set of M $x_{0,i}$'s, $x_{1,i}$'s and $x_{2,i}$'s in the above example). Alternatively, an adaptive procedure is used that combines cross-coupling estimation and equalization separately for each target cell. One such adaptive procedure is a steepest descent algorithm that seeks to determine the k correction coefficients $a_j$ of the linear model of inter-cell cross coupling, $$\hat{x}_0 = \sum_{j=0}^{k} x_j a_j. \quad (13)$$

Define the estimation error as:

$$e(\hat{x}_0) = \hat{x}_0 - d(\hat{x}_0) \quad (14)$$

where $d(\hat{x}_0)$ is the value of $\mu_s$ (the mean threshold voltage of all cells in state s), from among the $\mu_s$'s of all the states s, for which $|e(\hat{x}_0)|$ is minimal. Starting with $x_0$ as the initial estimate of $\hat{x}_0$, $\hat{x}_0$ and the $\alpha_j$ are found iteratively, with, in the n-th iteration, $$\alpha_j(n+1) = \alpha_j(n) - \delta \cdot e(\hat{x}_0) \cdot x_0 \quad (15)$$

where the step size $\delta$ is determined as in the analogous ISI problem. See e.g. John G. Proakis, *Digital Communications* (McGraw-Hill, 2000), Chapter 11.

Another more accurate, albeit computationally more intensive, form of adaptive cross-coupling estimation and equalization uses a Kalman filter to estimate the correction coefficients $\alpha_j$, analogous to the use of a Kalman filter for channel estimation and equalization in the communication engineering context by Tonissen et al. in U.S. Pat. No. 6,295,326. See also Dai Qingyuan and E. Shwedyk, Detection of bandlimited signals over frequency selective Rayleigh fading channels, *IEEE Transactions on Communication* vol. 42 no. 2 (1994) pp. 941-950.

Other adaptive channel estimation and equalization algorithms that are known in the ISI context and that can be adapted readily by one skilled in the art to inter-cell cross coupling estimation and correction include:

Singed LMS (Simon Haykin, *Adaptive Filter Theory, Third Edition*, Prentice Hall, 1996; R. D. Gitlin et al., An algorithm for the stable operation of a digitally implemented fractionally spaced adaptive equalizer, *Proc. IEEE Int. Conf. Acoust. Speech Signal Process.*, May 1982, pp. 1379-1382)

CMA algorithm (R. Johnson, Jr., et al., Blind equalization using the constant modulus criterion: a review, *Proc. IEEE* vol. 86 no. 10 (1998) pp. 1927-1950)

SATO algorithm (Y. Sato, A method for self-recovering equalization for multilevel amplitude modulation system, *IEEE Trans. Commun.* vol. COM-23 (June 1975) pp. 679-682)

Godard algorithm (D. N. Godard, Self-recovering equalization and carrier tracking in two-dimensional data communication system, *IEEE Trans. Commun.* vol. COM-28 (November 1980) pp. 1867-1875)

SUNUA algorithm (Ching-Hsiang Tseng and Cheng-bin Lin, A stop-and-go dual-mode algorithm for blind equalization, *GLOBECOM '96* (18-22 Nov. 1996) vol. 2 pp. 1427-1431)

DMGSA algorithm (V. Weerackody and S. A. Kassam, Dual-mode type algorithms for blind equalization, *IEEE Trans. Commun.* vol. 42 no. 1 (1994) ppl 22-28)

Under either batch cross-coupling estimation or combined adaptive cross-coupling estimation and equalization, there is no need to re-read the data in order to equalize the data. The threshold voltages are read, stored in a buffer, and retrieved from the buffer as needed. For example, in the first LMMSE example above, in which the coefficients of the linear model of inter-cell cross coupling are determined in the cross-coupling estimation phase, the data in the buffer are used twice: first in the cross-coupling estimation phase for estimating the coefficients and then in the equalization phase to apply the estimated coefficients to the data.

Another classification of cross-coupling estimation and equalization methods is according to the estimation criteria. One preferred criterion is MMSE, in which the mean square error (MMSE) of the estimation is minimized. Another preferred criterion is MAP, in which the a-posteriori probability of the unknown parameter given the observations is maximized. Yet another preferred criterion is ML, in which the conditional probability of the observations given the unknown parameter is maximized. The MAP estimator requires knowledge of the joint probability distribution of the unknown parameter and the observations. The ML estimator requires knowledge of the conditional probability distribution of the unknown given the observations. Note that under certain conditions different estimation criteria can coincide. For example, under a Gaussian noise model the MMSE and the MAP criteria coincide. Another issue that can distinguish various estimation algorithms is whether the estimation looks for the optimal symbol estimation (under the relevant criterion) or for the optimal estimation of the entire sequence of symbols. For the use of MAP channel estimation and equalization in communication engineering, see M. J. Lopez et al., Reduced-complexity MAP equalizer for dispersive channels, *IEEE Vehicular Technology Conference* 2000 vol. 3 pp. 1371-1375. ML algorithms that are known in the ISI context and that can be adapted readily by one skilled in the art to inter-cell cross coupling estimation and correction include:

RSSE algorithm (Nigel C. McGinty and Rodney A. Kennedy, Reduced-state sequence estimator with reverse-time structure, *IEEE Trans. Commun.* vol. 45 no. 3 (1997) pp. 265-268)

DDFSE algorithm (Alexanra Duel-Hallen and Chris Heegard, Delayed decision-feedback sequence estimation, IEEE Trans. Commun. vol. 37 no. 5 (1989) pp. 428-436)

DFE algorithm (Mikael Sternad et al., Robust decision feedback equalizers, *IEEE Int. Conf. Acoustics, Speech and Signal Processing* (Apr. 27-30, 1993) vol. 3 pp. 555-558)

Note that these ML algorithms are nonlinear algorithms.

Any of these methods may be employed for cross-coupling estimation in any one of the following stages in the lifecycle of flash memory devices, depending on whether, or on how fast, the devices' cross coupling coefficients vary among the devices, with time, and with use of the devices:

1. Design
2. Fabrication
3. Background
4. On-the-fly

If the cross-coupling coefficients (or, more generally, the parameters of a nonlinear inter-cell cross coupling model) can be assumed to be the same for all devices of a common design, then, during design, an experimental device is programmed with random data and one of the above methods is used to determine the cross-coupling coefficients of the experimental device. Those cross-coupling coefficients are stored in all production devices and are used for all production devices.

If the cross-coupling coefficients can not be assumed to be the same for all devices of a common design but can be assumed to vary negligibly over the lifetime of each device, then, during fabrication, each device is programmed with random data and one of the above methods is used to determine the cross-coupling coefficients of the device. These cross-coupling coefficients are stored in the device and are used for the entire lifetime of the device.

Note that cross-coupling coefficient determination for the full lifetime of a device (done in fabrication) or for a device model (done in design) does not make assumptions about the data stored in the cells, for example that a cell determined to have a threshold voltage $x_0$ was programmed to store the data of the corresponding threshold voltage range. The random data used for full lifetime determination are known a priori.

If the cross-coupling coefficients vary slowly over the lifetime of a device, and also vary slowly relative to the number of program-erase cycles that the device endures, then any one of the above methods is used in batch mode to determine the cross-coupling coefficients of the device, for each block of the device, in background.

If the cross-coupling coefficients vary too rapidly for background cross-coupling estimation to be reliable, cross-coupling estimation is performed along with equalization whenever a word line is read. Note that when the target word line is read, all the word lines that include neighbor cells (typically, only one other word line) also must be read.

Figure 2A:
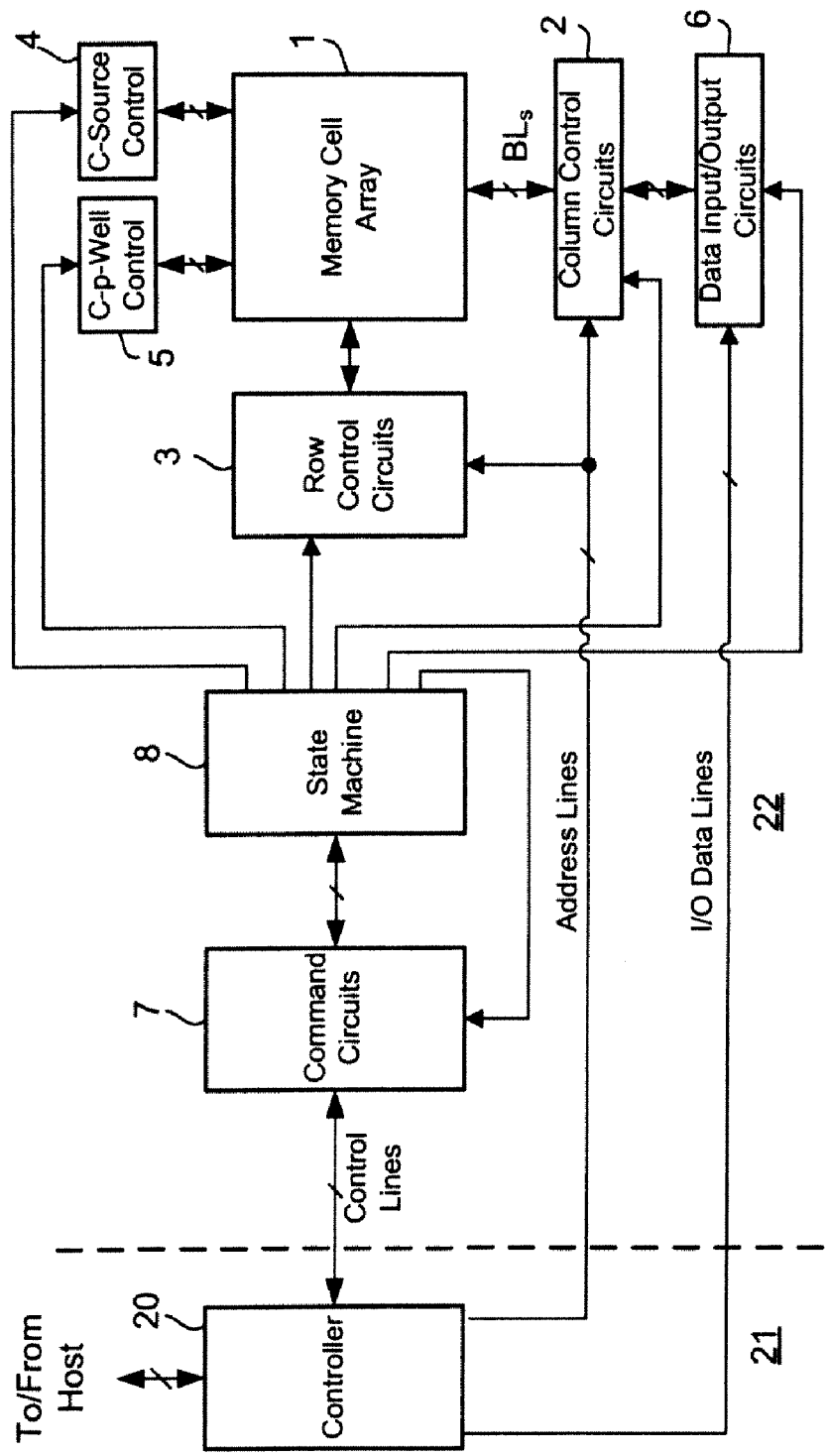
FIGS. 2A and 2B are block diagrams of flash memory devices.

In addition to illustrating a prior art flash memory device, FIG. 2A also illustrates a flash memory device of the present invention in which equalization is done in hardware. Under the first three options for when cross-coupling estimation is performed (design, fabrication, background), controller 20 includes a table of cross-coupling coefficients that data input/output circuits 6 apply to threshold voltages read by column control circuits 2. Under the fourth option for when cross-coupling estimation is performed (on-the-fly), data input/output circuits 6 also are configured to send selected threshold voltages, as read, to controller 20. Controller 20 then uses one of the methods described above to compute the relevant cross-coupling coefficients and sends the computed cross-coupling coefficients back to data input/output circuits 6 to be applied to the threshold voltages as read. Note that to make the table of cross-coupling coefficients more compact, the same cross-coupling coefficients may be used for all the target cells of a word line, or for all the target cells of a block, or for all the target cells of all the even-numbered word lines of a block vs. all the target cells of all the odd-numbered word lines of a block (because the coefficients of even-numbered word lines may be different from the coefficients of odd-numbered word lines), or for all the target cells of all the even-numbered bit lines of a block vs. all the target cells of all the odd-numbered bit lines of a block (because the coefficients of even-numbered bit lines may be different from the coefficients of odd-numbered bit lines), or for all the target cells in corresponding positions in several word lines or in several blocks, relative to the respective neighbor cells of these target cells.

Figure 2B:
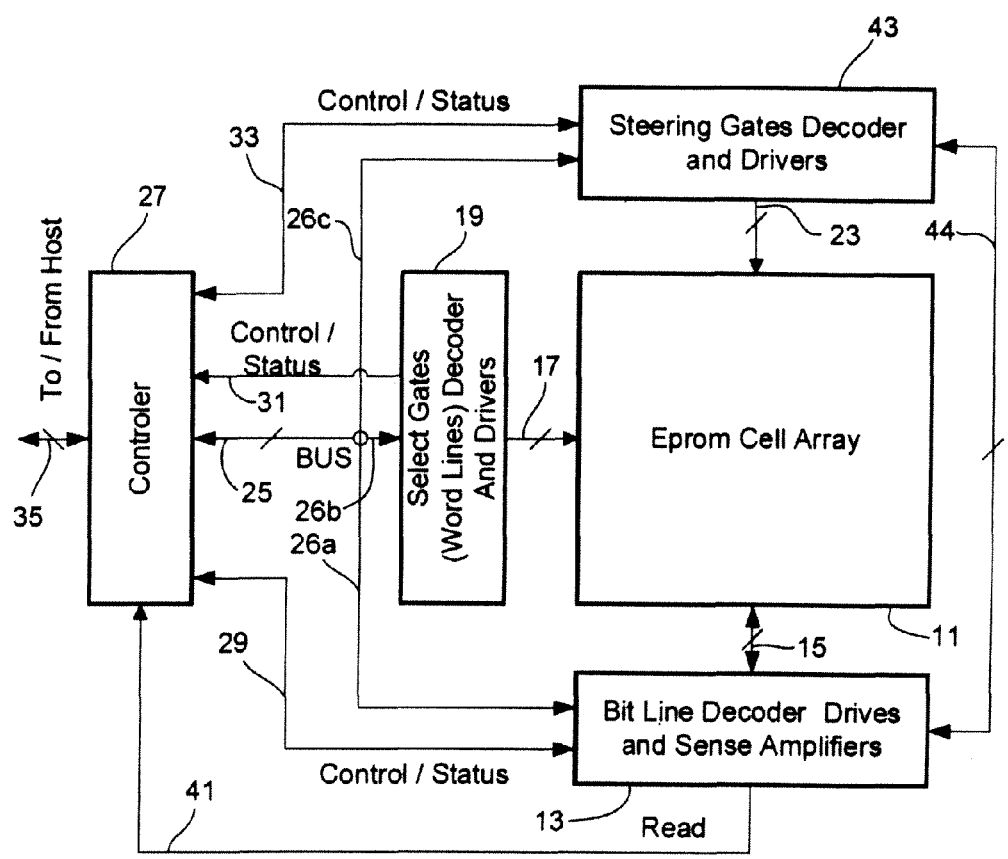
Figure 3:
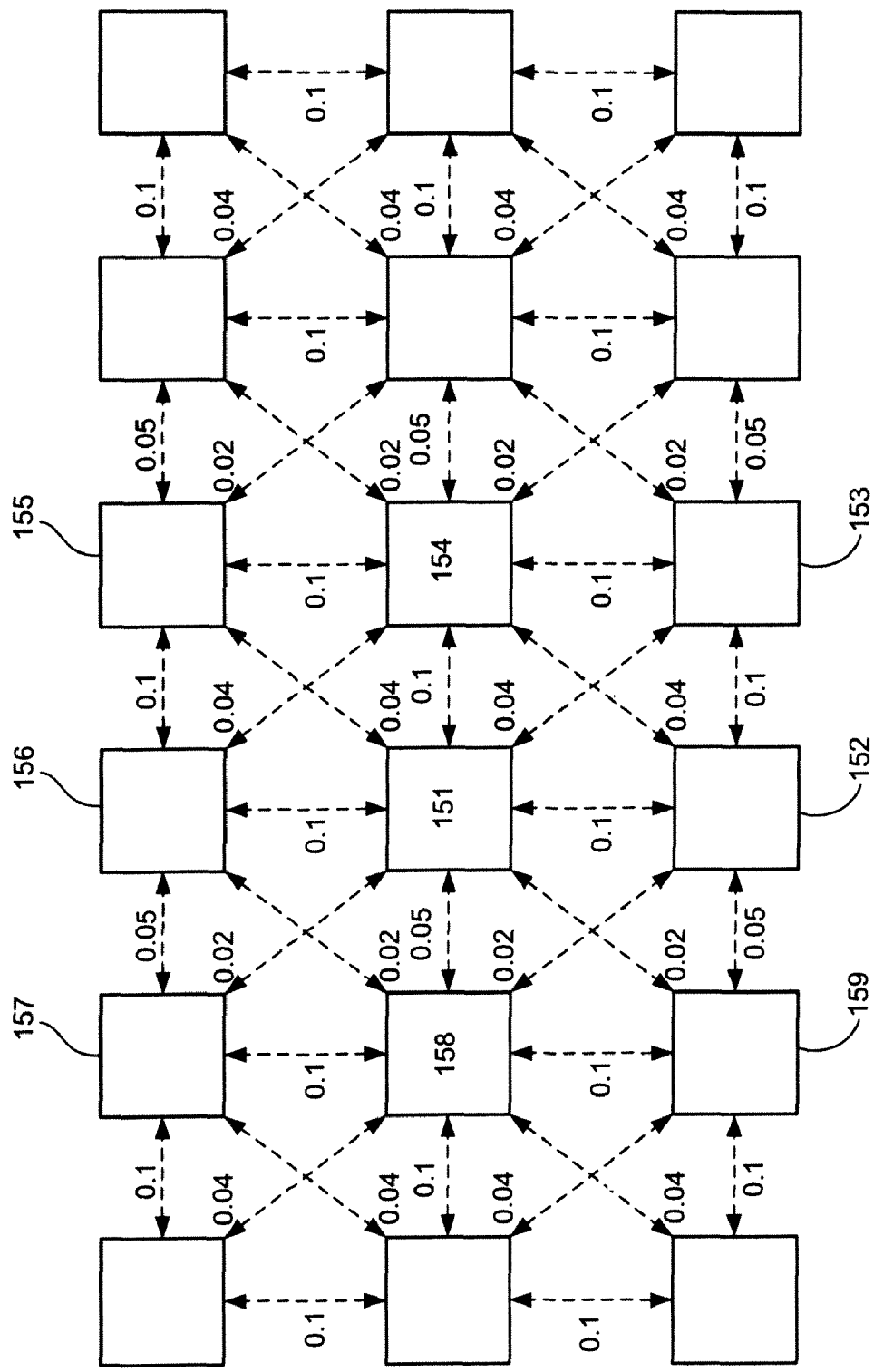
FIG. 3 illustrates an array of cross-coupled flash memory cells.

In addition to illustrating a prior art flash memory device, FIG. 2B also illustrates a flash memory device of the present invention in which equalization is done by firmware or software in controller 27. Controller 27 includes a table of cross-coupling coefficients that controller 27 applies to threshold voltage measurements received from bit line unit 13. Under the first two options for when cross-coupling estimation is performed (design, fabrication), the table is fixed for the lifetime of the device. Under the second two options for when cross-coupling estimation is performed (background, on-the-fly), controller 27 uses one of the methods described above to compute the cross-coupling coefficients from threshold voltage measurements received from bit line unit 13. As in the case of the device of FIG. 2A, to make the table of cross-coupling coefficients more compact, the same cross-coupling coefficients may be used for all the target cells of a word line, or for all the target cells of a block, or for all the target cells of all the even-numbered word lines of a block vs. all the target cells of all the odd-numbered word lines of a block (because the coefficients of even-numbered word lines may be different from the coefficients of odd-numbered word lines), or for all the target cells of all the even-numbered bit lines of a block vs. all the target cells of all the odd-numbered bit lines of a block (because the coefficients of even-numbered bit lines may be different from the coefficients of odd-numbered bit lines), or for all the target cells in corresponding positions in several word lines or in several blocks, relative to the respective neighbor cells of these target cells.

Figure 5:
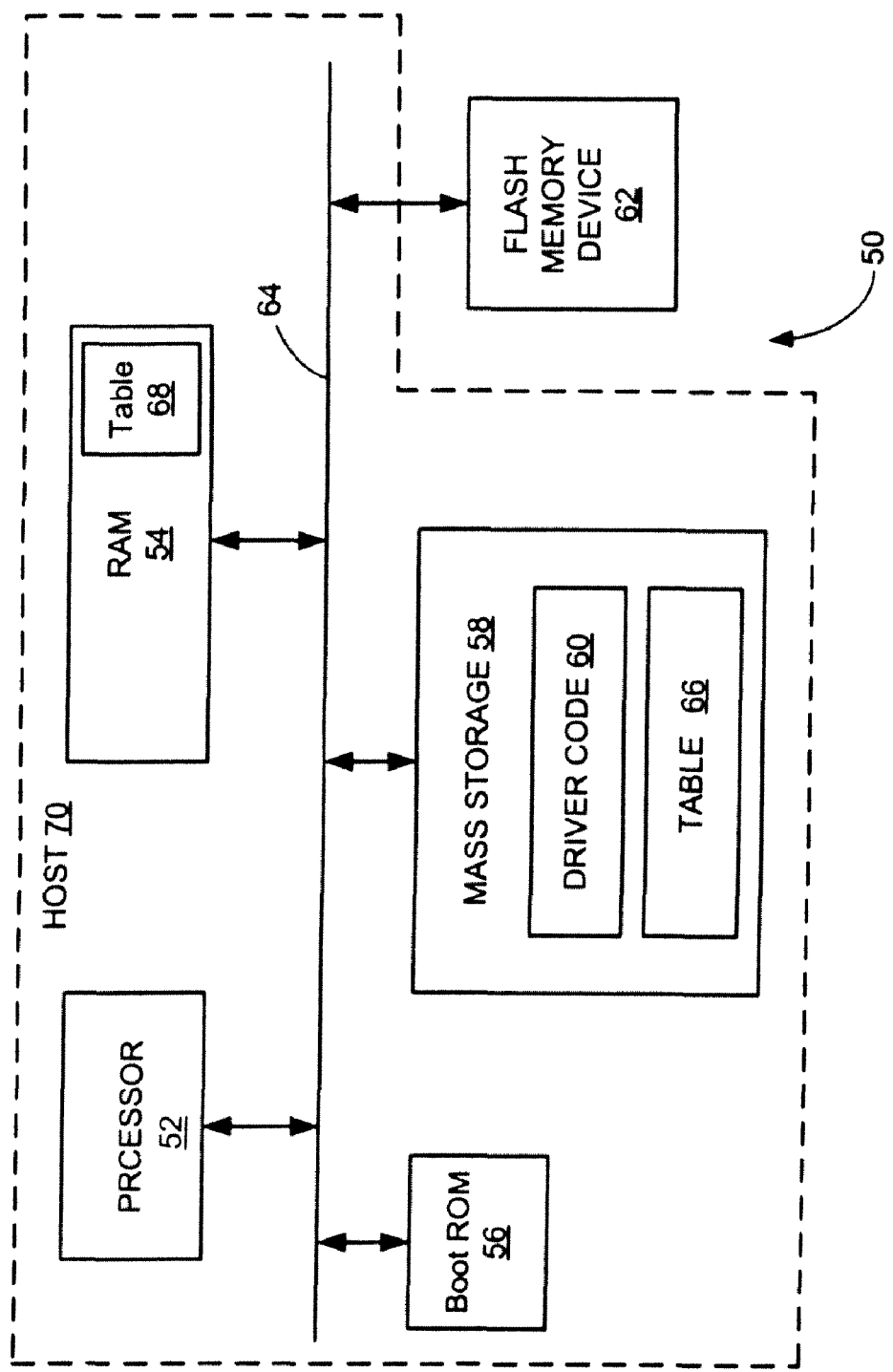
FIG. 5 is a high-level block diagram of a system of the present invention.

FIG. 5 is a high-level block diagram of a system 50 of the present invention. System 50 includes a processor 52 and four memory devices: a RAM 54, a boot ROM 56, a mass storage device (hard disk) 58 and a flash memory device of FIG. 2B as a flash memory device 62, all communicating via a common bus 64. In system 50, controller 27 of flash memory device 62 functions only as an interface to bus 64; the rest of the functionality of flash controller 27 of FIG. 2B as described above is emulated by flash memory driver code 60 that is stored in mass storage device 58 and that is executed by processor 52 to interface between user applications executed by processor 52 and flash memory device 62, and to manage the flash memory of flash memory device 62. In addition to the conventional functionality of such flash management driver code, driver code 60 emulates the functionality of controller 27 of FIG. 2B with respect to implementing the methods of the present invention. Specifically, under the first three options for when cross-coupling estimation is performed (design, fabrication, background), mass storage device 58 also has stored therein a table 66 of cross-coupling coefficients for flash memory device 62. Under the first two options for when cross-coupling estimation is performed (design, fabrication), this table is provided along with flash memory device 62 and is used by processor 52 when executing driver code 60 to correct threshold voltage measurements, as received from flash memory device 62, for inter-cell cross coupling. Under the third option for when cross-coupling estimation is performed, processor 52 executes the appropriate driver code 60 to compute the cross-coupling coefficients in background, based on threshold voltage measurements as received from flash memory device 62, to store these cross-coupling coefficients in table 66, and to use these cross-coupling coefficients to correct threshold voltage measurements, as read from flash memory device 62, for inter-cell cross coupling. Under the fourth option for when cross-coupling estimation is performed, whenever processor 52 receives threshold voltage measurements from flash memory 62, processor 52 executes the appropriate driver code 60 to compute cross-coupling coefficients, to store these cross-coupling coefficients in a table 68 in RAM 54, and to use these cross-coupling coefficients to correct the threshold voltage measurements for inter-cell cross coupling. Driver code 60 typically is included in operating system code for system 50 but also could be freestanding code.

The components of system 50 other than flash memory device 62 constitute a host 70 of flash memory device 62. Mass storage device 58 is an example of a computer-readable storage medium bearing computer-readable driver code for implementing the present invention. Other examples of such computer-readable storage media include read-only memories such as CDs bearing such code.

While the invention has been described with respect to a limited number of embodiments, it will be appreciated that many variations, modifications and other applications of the invention may be made.

What is claimed is:
1. A method of storing and reading data, comprising:
   (a) providing a memory that includes a plurality of cells, data being stored in said cells by setting respective values of a physical property of said cells to be indicative of said data, said cells subsequently being read by measuring said respective values to obtain respective measurements of said respective values;
   (b) reading one of said cells and at least one neighbor cell of said one cell, thereby obtaining said respective measurements for said one cell and for each said neighbor cell; and
   (c) estimating respective said data that have been stored in said one cell, based on said respective measurements and on a respective extent which each said neighbor cell disturbs said reading of said one cell; and
   (d) determining said respective extent to which said each said neighbor cell disturbs said reading of said one cell; wherein determining is based on a nonlinear model of said disturbing.
2. The method of claim 1, wherein said cells are flash cells and wherein said physical property is a threshold voltage of said flash cells.
3. The method of claim 1, further comprising of:
   (e) storing said data in said one cell and in each said at least one neighbor cell.
4. The method of claim 1, wherein said determining is effected before said storing.
5. The method of claim 1, wherein said determining is effected iteratively along with said estimating.
6. A method of storing and reading data, comprising:
   (a) providing a memory that includes a plurality of cells, data being stored in said cells by setting respective values of a physical property of said cells to be indicative of said data, said cells subsequently being read by measuring said respective values to obtain respective measurements of said respective values;
   (b) reading one of said cells and at least one neighbor cell of said one cell, thereby obtaining said respective measurements for said one cell and for each said neighbor cell; and
   (c) determining said respective extent to which said each said neighbor cell disturbs said reading of said one cell, wherein said determining is based on a nonlinear model of said disturbing; and
   (d) estimating respective said data that have been stored in said one cell, based on said respective measurements and on the respective extent which each said neighbor cell disturbs said reading of said one cell, said estimating is a computation that does not include re-setting of the respective measurements.
7. The method of claim 6, wherein said cells are flash cells and wherein said physical property is a threshold voltage of said flash cells.
8. The method of claim 7, further comprising of:
   (e) storing said data in said one cell and in each said at least one neighbor cell.
9. The method of claim 6, wherein said determining is effected before said storing.
10. The method of claim 6, wherein said determining is effected iteratively along with said estimating.

11. A method of storing and reading data, comprising:
(a) providing a memory that includes a plurality of cells, data being stored in said cells by setting respective values of a physical property of said cells to be indicative of said data, said cells subsequently being read by measuring said respective values to obtain respective measurements of said respective values;
(b) reading one of said cells and at least one neighbor cell of said one cell, thereby obtaining said respective measurements for said one cell and for each said neighbor cell; and
(c) determining said respective extent to which said each said neighbor cell disturbs said reading of said one cell, wherein said determining is based on a nonlinear model of said disturbing;
(d) estimating respective said data that have been stored in said one cell, based on said respective measurements and on the respective extent which each said neighbor cell disturbs said reading of said one cell, said estimating is a computation that does not include re-setting of the respective measurements; and
(e) storing said data in said one cell and in each said at least one neighbor cell.

12. The method of claim 11, wherein said cells are flash cells and wherein said physical property is a threshold voltage of said flash cells.

13. The method of claim 11, wherein said determining is effected before said storing.

14. The method of claim 11, wherein said determining is effected iteratively along with said estimating.

* * * * *